(12) United States Patent
Ham et al.

(10) Patent No.: US 7,464,807 B2
(45) Date of Patent: Dec. 16, 2008

(54) TRANSFER DEVICE OF HANDLER FOR TESTING SEMICONDUCTOR DEVICE

(75) Inventors: Chul Ho Ham, Yongin-si (KR); Woo Young Lim, Seoul (KR); Young Geun Park, Yongin-si (KR); Ho Keun Song, Seongnam-si (KR)

(73) Assignee: Mirae Corporation, Chonan-si (KR)

( * ) Notice: Subject to any disclaimer, the term of this patent is extended or adjusted under 35 U.S.C. 154(b) by 320 days.

(21) Appl. No.: 11/200,014

(22) Filed: Aug. 10, 2005

(65) Prior Publication Data
US 2006/0119345 A1 Jun. 8, 2006

(30) Foreign Application Priority Data
Dec. 6, 2004 (KR) ...................... 10-2004-0101753

(51) Int. Cl.
*G01R 31/28* (2006.01)
*B65G 37/00* (2006.01)
(52) U.S. Cl. ................ 198/468.3; 198/468.4; 294/64.1; 294/65; 294/87.1; 414/749.5; 414/752.1; 414/416.02
(58) Field of Classification Search .............. 198/468.3, 198/468.4; 294/64.1, 65, 87.1; 414/749.5, 414/752.1, 416.02
See application file for complete search history.

(56) References Cited

U.S. PATENT DOCUMENTS

| | | | | | |
|---|---|---|---|---|---|
| 4,597,819 | A | * | 7/1986 | Kusuhara et al. | 156/345.54 |
| 5,575,376 | A | * | 11/1996 | Colamussi | 198/468.3 |
| 5,839,769 | A | * | 11/1998 | Slocum et al. | 294/87.1 |
| 6,068,317 | A | * | 5/2000 | Park | 294/87.1 |
| 6,352,402 | B1 | * | 3/2002 | Hwang et al. | 414/752.1 |
| 6,439,631 | B1 | * | 8/2002 | Kress | 294/65 |
| 7,023,197 | B2 | * | 4/2006 | Jung | 324/158.1 |
| 7,234,744 | B2 | * | 6/2007 | Osten et al. | 294/65 |

FOREIGN PATENT DOCUMENTS

JP 2002-164413 6/2002

* cited by examiner

*Primary Examiner*—Mark A Deuble
(74) *Attorney, Agent, or Firm*—Ked & Associates, LLP

(57) ABSTRACT

A transfer device of a handler for testing semiconductor devices is provided in which a pitch between each of a plurality of picker heads may be adjusted without replacing a cam plate. The transfer device may include a base part, a plurality of picker heads movably mounted on the base part, and a cam plate movably mounted on the base part and having a plurality of inclined cam grooves formed therein. Each picker head is connected to a corresponding cam groove by a connection part extending therebetween, with an end of each connection part movably coupled to its respective cam groove. A driving unit reciprocates the cam plate so that, as the ends of the connection parts move within the cam grooves, a position of the picker heads may be varied.

11 Claims, 11 Drawing Sheets

TRANSFER DEVICE OF HANDLER FOR TESTING SEMICONDUCTOR DEVICE

This application claims the benefit of the Patent Korean Application No. P2004-101753, filed on Dec. 6, 2004 which is hereby incorporated by reference as if fully set forth herein.

BACKGROUND OF THE INVENTION

1. Field of the Invention

The present invention relates to a handler, and more particularly, to a transfer device of a handler for testing semiconductor device in which a pitch of each head of picker heads for absorbing and transferring semiconductors may be adjusted easily and variously.

2. Discussion of the Related Art

Generally, Module ICs including memory or non-memory semiconductors on one substrate circuitously and appropriately are released after various steps when manufactured. A handler is a device which automatically transfers the Module ICs such as semiconductors to a process and then tests them.

Commonly, after a handler re-installs semiconductors, contained in each user tray of a loading part, in a test tray using a transfer device, a handler transfers the test trays to a test site and then performs a testing. In succession, the handler re-contains the tested semiconductors in user trays of an unloading part according to the test results.

However, since pitches between each semiconductor lining up in the user tray are different from pitches between each semiconductor lining up in the test tray, pitches between each head of the picker heads should be varied.

That is, in a transfer device, the pitches between each picker head should be varied each into the pitches between each semiconductor in the user tray and/or the pitches between each semiconductor in the test tray.

The applicant of the present invention developed a transfer device capable of precisely and rapidly adjusting distances of picker heads in a simple structure without using a complex link. In Korea Patent First Publication 10-0248704 (date of publication: Mar. 15, 2000) is disclosed a device for adjusting each semiconductor pitch of a semiconductor tester wherein a cam shaft or a cam plate having a plurality of cam grooves formed inclined therein is installed and some part of each picker head is relative-movably connected to each cam groove of the cam shaft or the cam plate. In the device for adjusting each semiconductor pitch, when rotating the cam shaft by using a rotatory cylinder or rectilinearly moving the cam plate by a pneumatic cylinder, each picker head relatively moves along each cam groove of the cam shaft, thereby adjusting the pitch between each picker head performed.

More specifically, in the device for adjusting each semiconductor pitch there are two pitch adjusting steps. In a first step, when an end of a picker head is located at a first end of a cam shaft or a cam groove of a cam plate, the pitch between each picker head is minimized. In a second step, when a cam shaft is rotated by a rotatory cylinder or a pneumatic cylinder, or a cam plate rectilinearly moves and then an end of a picker head moves into a second end of a cam groove, the pitch between each picker head is maximized However, since a conventional device for adjusting each semiconductor pitch includes only two steps of the maximum distance and the minimum distance for adjusting the pitch between each picker head, the cam shaft or the cam plate should be replaced to the ones corresponding with each semiconductor in case that the kinds and sizes of the semiconductors are varied.

In other words, when the kinds or the sizes of the semiconductors to be tested are varied, the pitches between the semiconductors in the user trays and the test trays are also varied. Thus, in case that the cam shaft or the cam plate is not replaced with the one suitable for the semiconductors, pitches between the semiconductors in the user tray and the semiconductors in the test tray do not accord with the pitches between the picker heads, thereby the test not being performed.

As a result, conventionally whenever the kinds and/or the sizes of the semiconductors to be tested are varied, the cam shaft or the cam plate is replaced with the one suitable for the semiconductors. Therefore, the replacing process is so complex and difficult that it takes much time and may cause a problem of deteriorating work efficiency and productivity.

SUMMARY OF THE INVENTION

Accordingly, the present invention is directed to a transfer device of a handler for testing semiconductor device that substantially obviates one or more problems due to limitations and disadvantages of the related art.

An object of the present invention is to provide a transfer device of a handler for testing semiconductor device capable of adjusting a pitch between each picker head absorbing semiconductors as wanted without replacing a cam plate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transfer device of a handler for testing semiconductor device for detachably securing a plurality of semiconductors and transferring them to a preset location is provided with a base part; a plurality of picker heads for securing/detaching the semiconductors; a cam plate movably mounted in the base part, wherein a plurality of cam grooves is formed inclined; connecting parts for connecting each picker heads with each cam groove, wherein a first side thereof is secured to each picker and a second side thereof is relative-movably connected to each cam groove; and a driving unit for reciprocating the cam plate so as that each connecting part is alternately located in a first discretionary position or a second discretionary position and then each picker head may be varied to a first discretionary position or a second discretionary position.

According to an embodiment of the present invention, the driving unit comprises a motor mounted in the base part, being capable of controlling a discretionary location, a power transmission part for converting a power of the motor to a reciprocating motion of the cam plate, and a guide member for guiding the reciprocating motion of the cam plate.

according to the present invention, in case that a pitch between each picker head should be adjusted because the kinds or the sizes of the semiconductors tested in a handler are varied, a control signal of a motor driving a cam plate is varied without replacing a cam plate, so that the location of the cam plate may be discretionarily varied, thereby capable of adjusting the pitch of each picker head to a discretionary distance as wanted.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
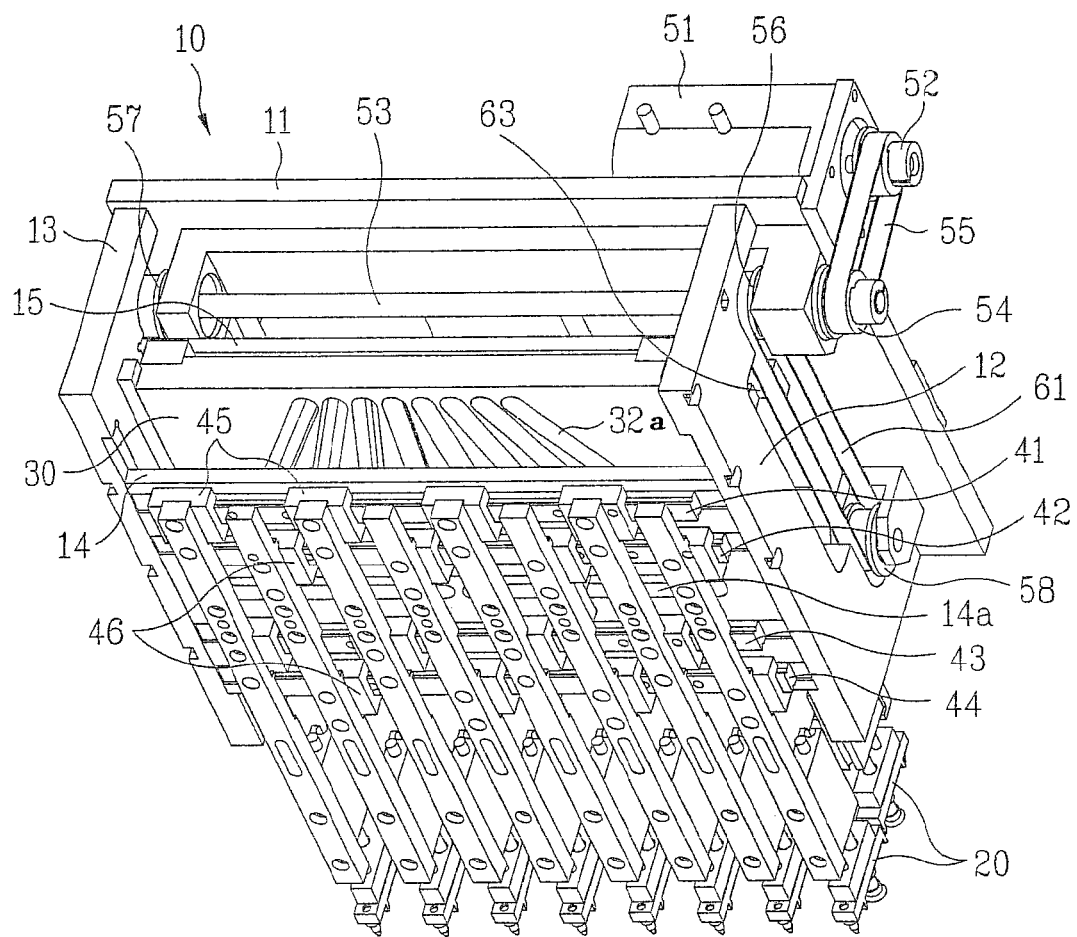
FIG. 1 illustrates a perspective front view showing a structure of an embodiment of a transfer device according to the present invention.

Reference will now be made in detail to the preferred embodiments of the present invention, examples of which are illustrated in the accompanying drawings. Wherever possible, the same reference numbers will be used throughout the drawings to refer to the same or like parts.

Referring to FIGS. 1 through 5, the detailed description of an embodiment of a transfer device according to the present invention is the following.

As shown in FIGS. 1 through 4, a transfer device according to the present invention comprises a base part 10 installed movable horizontally to a first to a third shaft of a X-Y gentry robot (not shown) mounted on a body (not shown) of a handler, a plurality of picker heads 20 installed in the base part 10 for absorbing semiconductors by means of a vacuous pressure. The picker heads 20 are arranged in a front and a rear portion of the base part 10, each comprising eight in two rows.

The base part 10 comprises a reciprocating block 11 mounted movably upward/downward on the X-Y gentry robot (not shown), two side plates 12, 13 connected perpendicularly in both side ends of the reciprocating block 11, facing each other, and two base plates 14, 15 installed parallel with a predetermined distance there between, both ends thereof connected to the side plates 12, 13.

Figure 2:
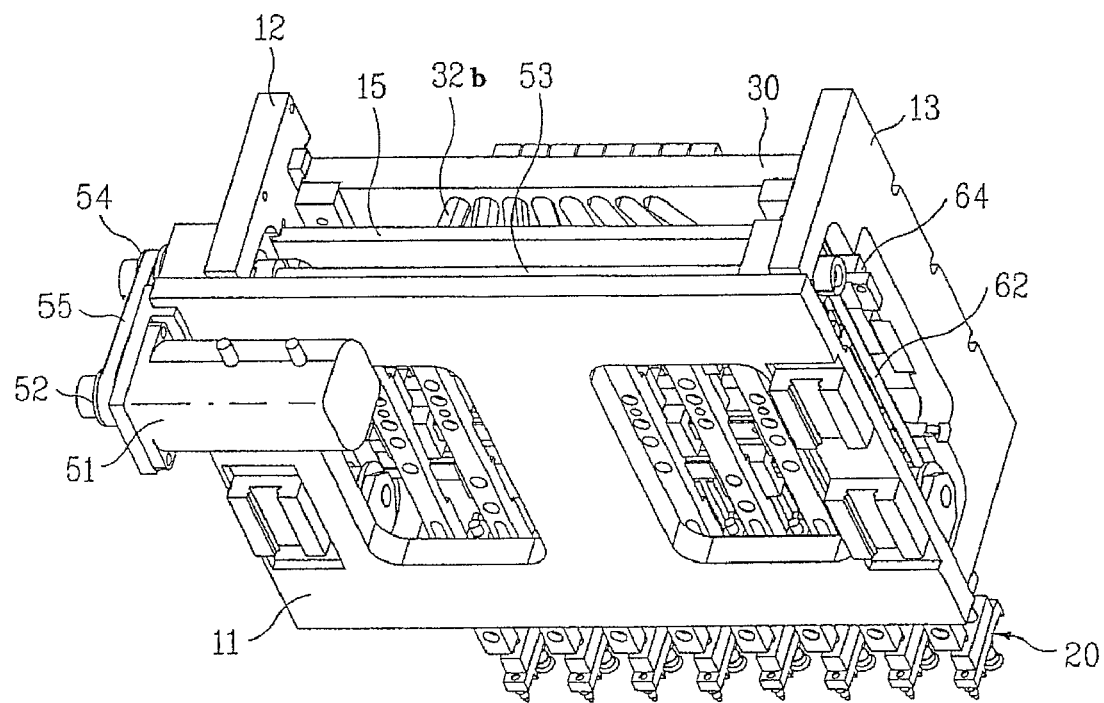
FIG. 2 illustrates a rear perspective view of the transfer device in FIG. 1.
Figure 3:
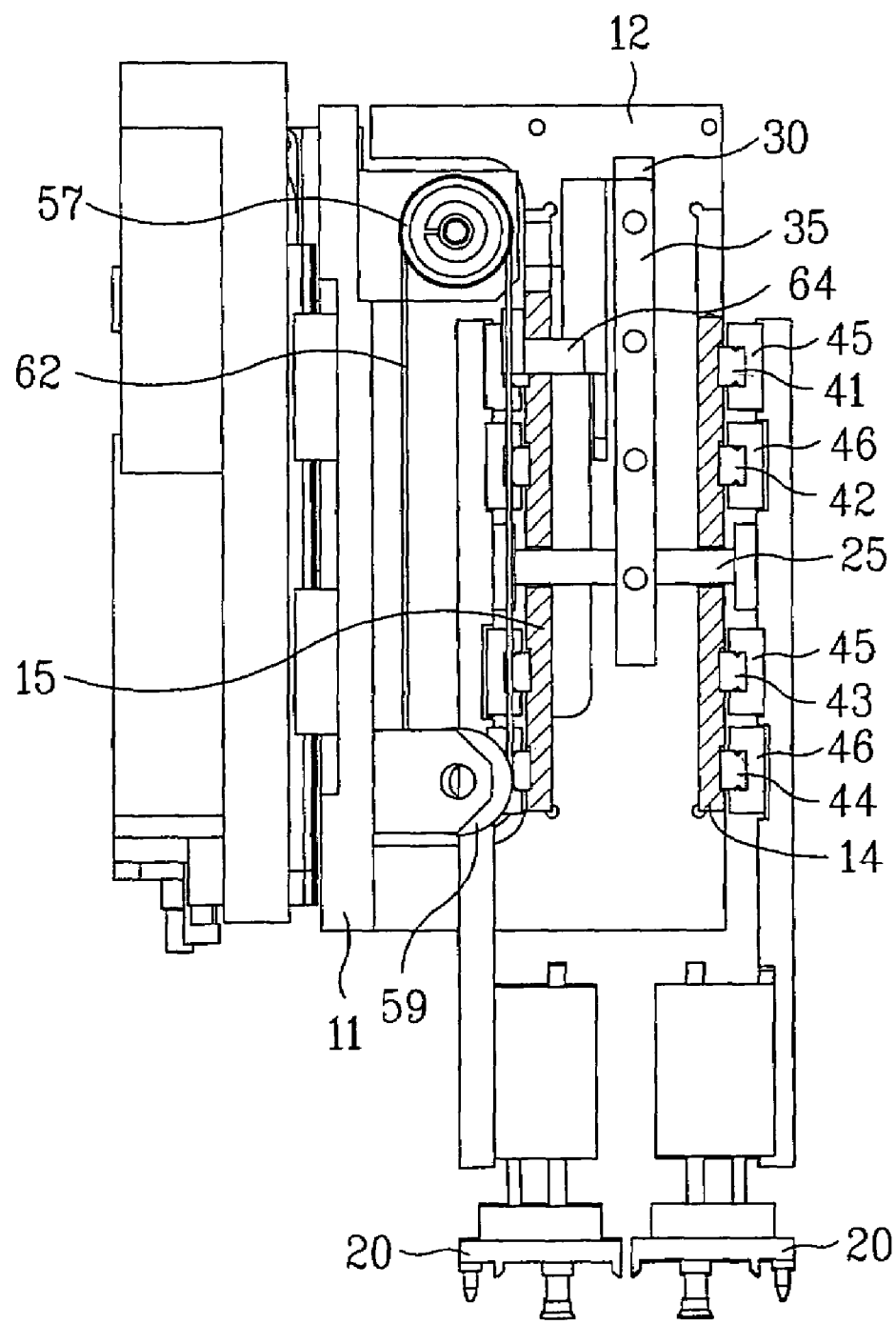
FIG. 3 illustrates a sectional view of key parts of the transfer device in FIG. 1.
Figure 4:
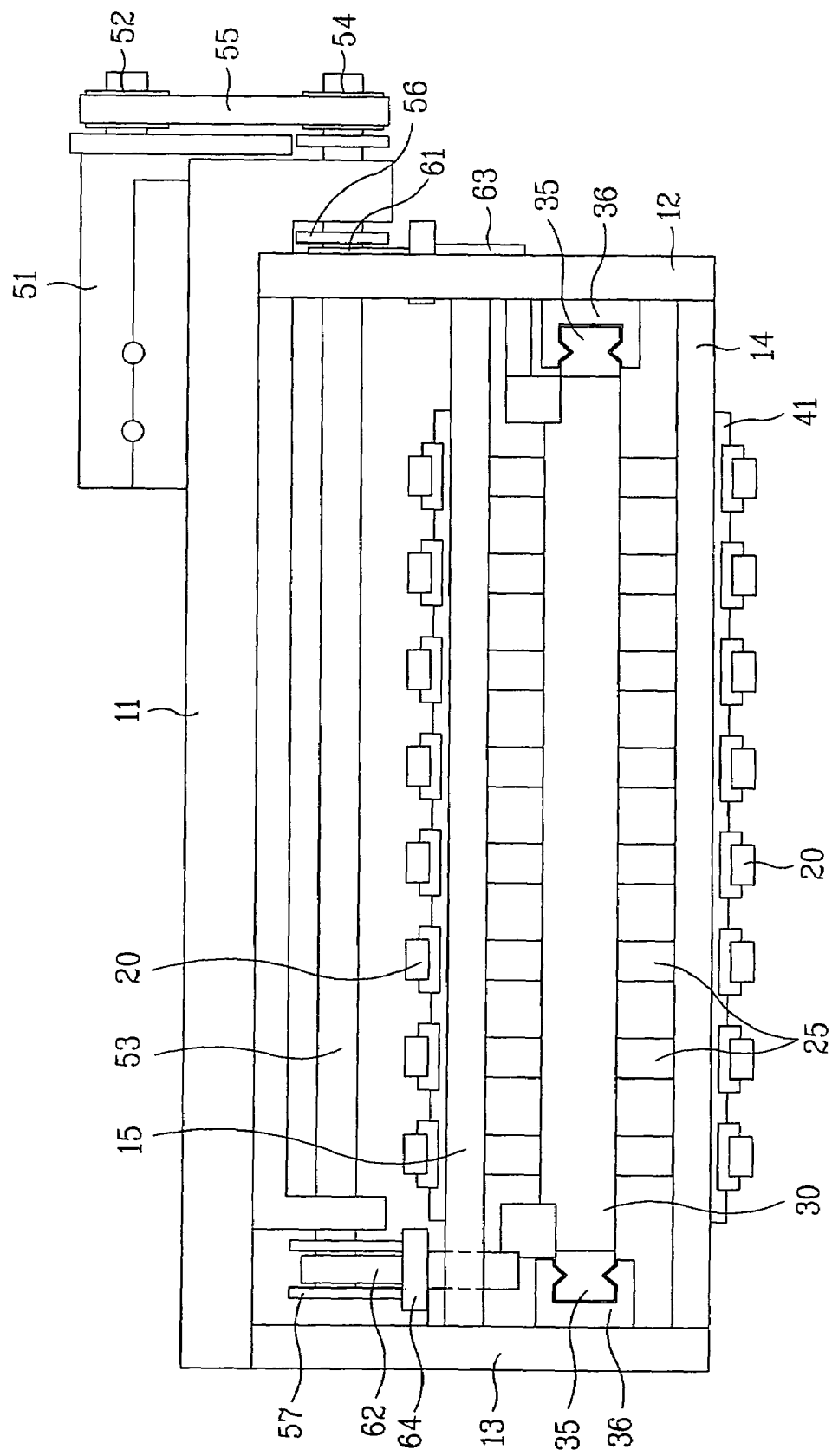
FIG. 4 illustrates a plan view of the transfer device in FIG. 1.

A cam plate 30 is installed movably upward/downward between the base plates 14, 15 for adjusting a pitch between each picker head 20. On the cam plate 30, a plurality of cam grooves 32 (eight cam grooves in an embodiment) is formed inclined in a diffuse direction from an upper side to a lower side. Cam grooves 32a are formed on a front surface of the cam plate 30, as shown in FIG. 1, and cam grooves 32b are formed on a rear surface of the cam plate 30, as shown in FIG. 2.

Also, a first to a fourth linear motion (LM) guide rail 41 to 44 leading the motion of each picker head 20 in horizontal direction are horizontally mounted on an upside and an downside of each base plate 14, 15 in a predetermined distance. Linear motion (LM) blocks 45, 46 respectively connected to the picker heads 20 are connected with the LM guide rails 41 to 44 for moving along the LM guide rails.

The LM blocks 45 connected with the picker heads 20 uneven numbered from a first side are connected with a first and a third LM guide 41, 43 of the LM guide rails, and the LM blocks 46 connected with the picker heads 20 even numbered from a first side are connected with a second and a fourth LM guide rails 42, 44 of the LM guide rails.

The reason why the LM blocks 45, 46 connected with each picker head 20 are alternately connected with the upper sides and the lower sides of the LM guide rails 41 to 44 is to prevent the sizes of the LM blocks 45, 46 from interfering adjusting a minimum pitch between each picker head 20.

In other words, just like an embodiment, if the LM blocks 45, 46 are connected to the same LM guide rails 41 to 44 in line, the LM blocks 45, 46 may be collided each other when adjusting the minimum pitch of each picker head 20, thereby adjusting the minimum pitch of each picker head 20 not performed, because the width of each LM block 45, 46 is bigger than the width of each picker head 20.

Of course, in case that the width of each LM block 45, 46 is smaller than the width of each picker head 20; only one or two LM guide rail(s) may be used and the LM blocks connected to each picker head 20 may be connected to the same LM guide rails in line.

The LM guide rails 35 are installed in an upward and downward direction on both sides of the cam plate 30 for reciprocating the cam plate 30 upward/downward.

For reciprocating the cam plate 30 upward/downward, LM guide rails 35 are installed in both sides of the cam plate 30 and a LM blocks 36 wherein the LM guide rails 35 are movably connected are installed in inner sides of the side plates 12, 13.

Thus, when an outside power is generated in the cam plate 30 in an upward/downward direction, the LM guide rails 35 receive leading of the LM blocks 36, thereby the cam plate 30 reciprocating upward/downward smoothly.

Also, a servo motor 51 is installed in a first side of the reciprocating block 11 so as to generate a driving power reciprocating the cam plate 30 upward/downward. A power transmission shaft 53 is rotatably installed in an upper end of the reciprocating block 11. A driving pulley 54 engaged with a shaft 52 of the servo motor 51 by the medium of a belt 55 for receiving a power is installed at a first end of the power transmission shaft 53. Also, a first upper pulley 56 is connected to a first side of the driving pulley 54 on the same shaft 53 and a second upper pulley 57 is also connected to the opposite side of the first upper pulley 56 on the same shaft 53.

A first lower pulley 58 and a second lower pulley 59 each engaged with the first upper pulley 56 and the second upper pulley 57 are rotatably installed in both sides of a lower end of the reciprocating block 11 by the medium of the first and second power transmission belts 61, 62.

The fist and second power transmission belt 61, 62 are each connected to both sides of the cam plate 30 by pieces 63, 64 of a first and a second ball screw 152.

Thus, when a signal is applied to the servo motor 51 and a shaft 52 is rotated in one direction, a power is transmitted to a driving pulley 54 by a belt 55 and then a power transmission shaft 53 and the first and a second upper pulley 56, 57 engaged with the power transmission shaft 53 are rotated. Thus, the first and second transmission belts 61, 62 reciprocate upward/downward and a cam plate reciprocates upward/downward by means of leading of a LM blocks 36.

Figure 5:
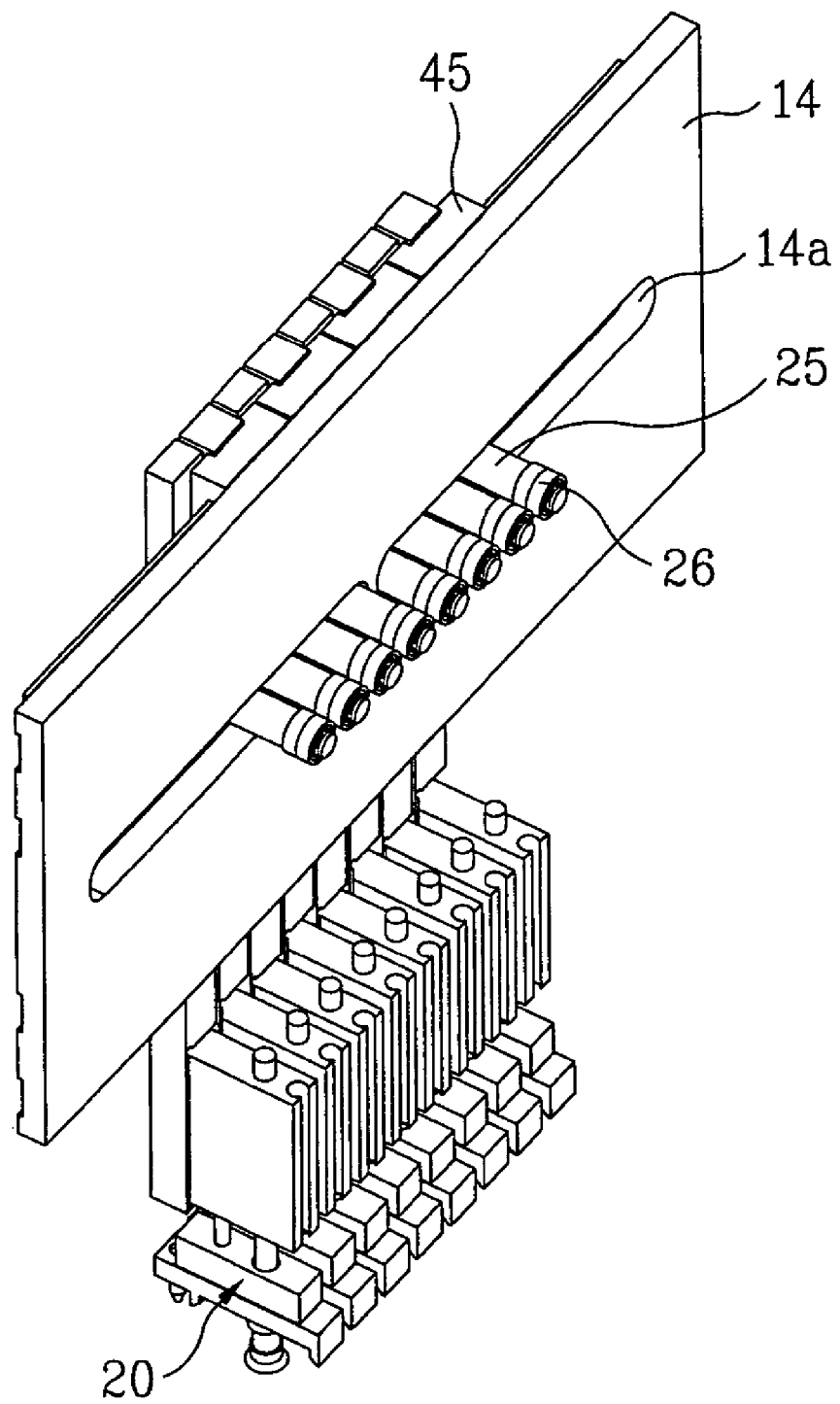
FIG. 5 illustrates a partial perspective view showing a partial structure of the transfer device in FIG. 1.

As shown in FIG. 5, guide holes 14a are formed as elongated hole shapes in a right-and-left direction on a center portion of the base plates 14, 15. Also, bars 25 of a ball screw (not shown in FIG. 5; see FIGs. 10-11) connected to cam grooves 32 of the cam plate 30 through the guide holes 14a are connected with each picker head 20. Rollers 26 are roll-movably installed at the end of each bar 25 for facilitating the relative movement between the cam grooves 32 and the bars 25.

The bars 25 connected to the picker heads 20 of a front of the base part 10 and the connection bars 25 connected to the picker heads 20 of a rear are connected together to the cam grooves 32 of the cam plate 30, and relatively move synchronously each other, thereby adjusting each pitch between the picker heads 20 uniformly.

Unlike an embodiment, cam grooves are formed in both sides of a cam plate to have an opposite phase difference each other, so that adjusting the pitch between each picker head of a front picker head row and each picker head of a rear picker head row may be performed reversely each other.

An operation method of a transfer device will be described.

Figure 6:
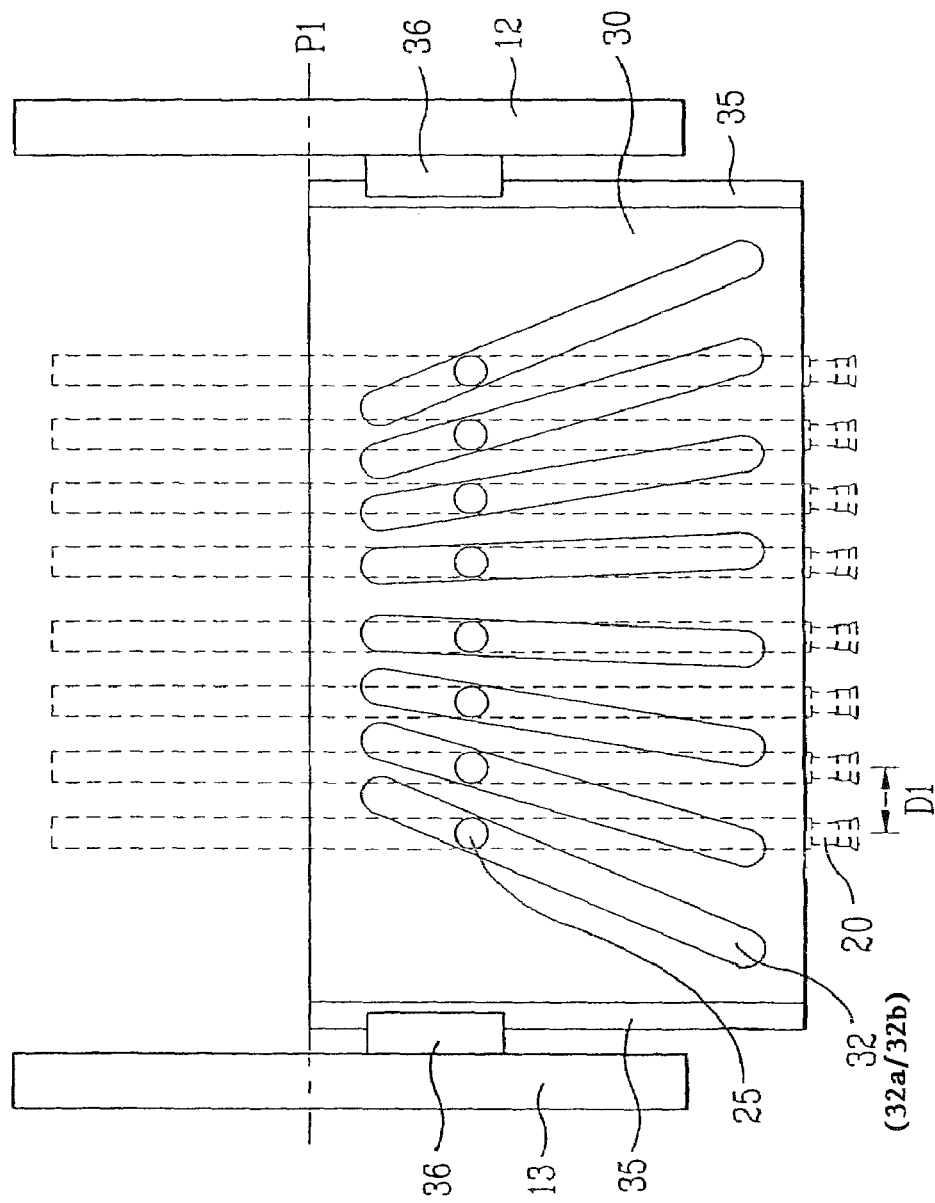
FIGS. 6 to 9 illustrate diagrams each showing an operation example of a transfer device according to the present invention.

Shown in FIG. 6, connecting bars 25 connected to each picker head 20 located in a first preset position (P1) of an upper end of cam grooves 32 of a cam plate 30 and then a pitch between each picker head 20 is supposed to maintain the minimum distance (D1). In this state, each picker head 20 of a transfer device vacuously absorbs semiconductors (not shown) on a user tray (not shown) and transfers the semiconductors to the position of a test tray (not shown).

In the middle of the transfer device moving, a preset control signal is applied to the servo motor 51 (referring to FIG. 1) through a control part of a handler, and then the servo motor 51 operates. As described above, the power is transmitted to the driving pulley 54 (referring to FIG. 1) by the means of the operation of the servo motor 51 and then the power transmission shaft 53 (referring to FIG. 1) is rotated and in succession the driving of the first and the second power transmission belt 61, 62 (referring to FIG. 1) reciprocates the cam plate 30 upward/downward.

Figure 7:
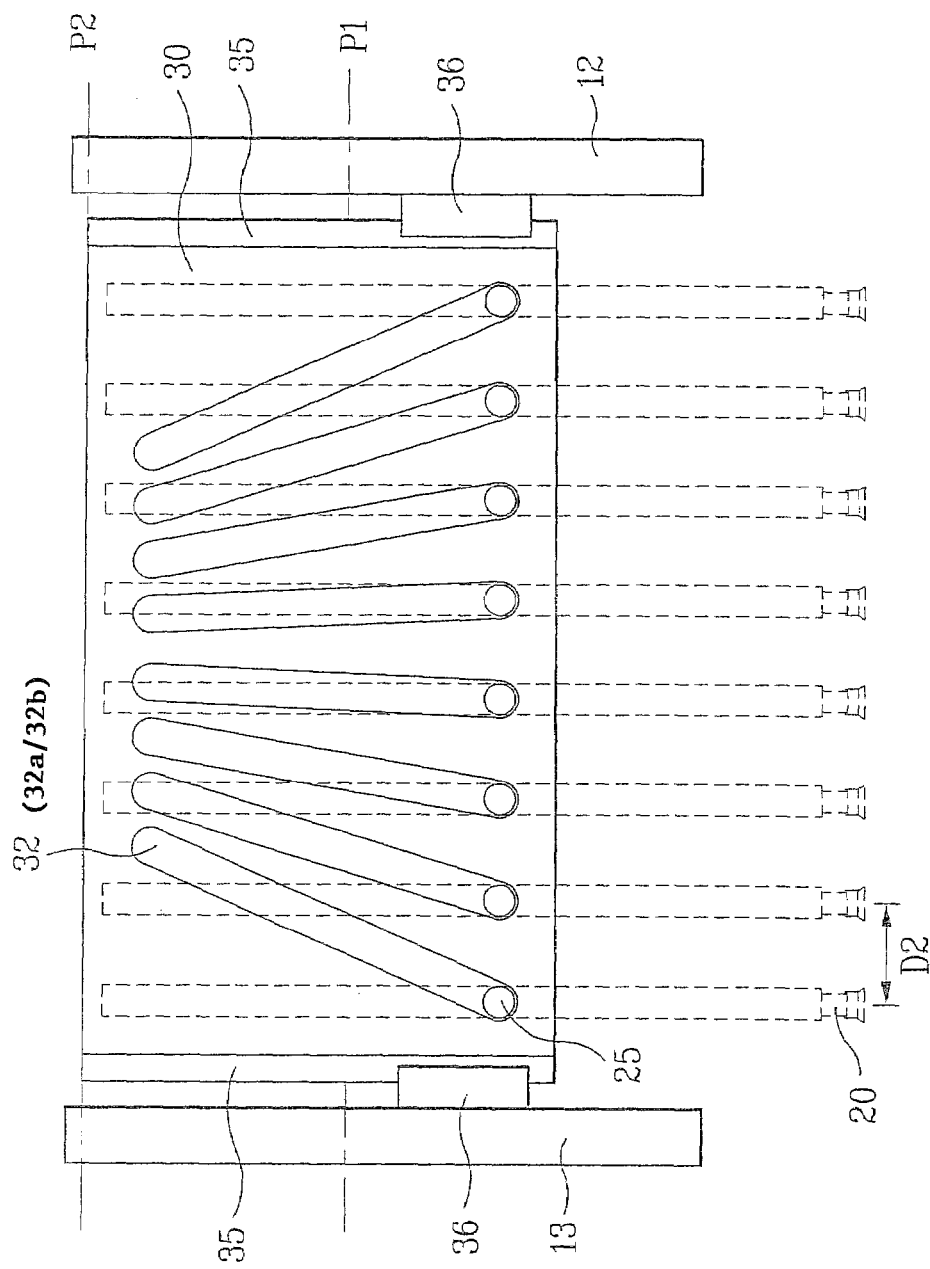

As shown in FIG. 7, connection bars 25 are getting widen along a path of each cam groove 32 according as the cam plate 30 is moving upward to a second preset position P2. Thus, each picker head 20 connected to the connection bars 25 is getting widen in a right-left direction along a first to a fourth LM guide rails 41 to 44, thereby the pitch between each picker head adjusted to the maximum distance D2. At that time, the pitch of each picker head 20 is equivalent to the pitch in which the semiconductors in a test tray (not shown) are deposited.

Hence, in the state when the pitch between each picker head 20 is adjusted to get widen, a transfer device moves and deposits semiconductors absorbed by the picker heads 20 to the test tray, or when unloading a transfer device vacuously absorbs the semiconductors tested completely in the test tray and transfers them to a user tray for unloading.

Thus, in case that the transfer device moves from a test tray position to a user tray position, a predetermined control signal is applied to a servo motor 51 and then the servo motor 51 operates as opposed to the operation described above. As the servo motor 51 operates as opposed, the first and the second power transmission belt 61, 62 also operate as opposed. Thus, the cam plate 30 is moving downward to a first preset position P1 again and then the connection bars 25 are getting narrowed along the path of each cam groove 32, as shown in FIG. 6.

Hence, each picker head 20 moves horizontally, thereby the pitch between each picker head 20 adjusted to the minimum distance.

When kinds and sizes of semiconductors which will be tested are varied, the pitch between each semiconductor in a user tray and the pitch between each semiconductor in a test tray are also varied. Also, the pitch between each picker head 20 is require to be changed according to each pitch varied. At this time, the user inputs a new control order of a servo motor 51 into a control part according to the kinds of each semiconductor without replacing a cam plate 30, and then newly converts the operation range of the servo motor 51, thereby setting up a new distance between each picker head 20.

Figure 8:
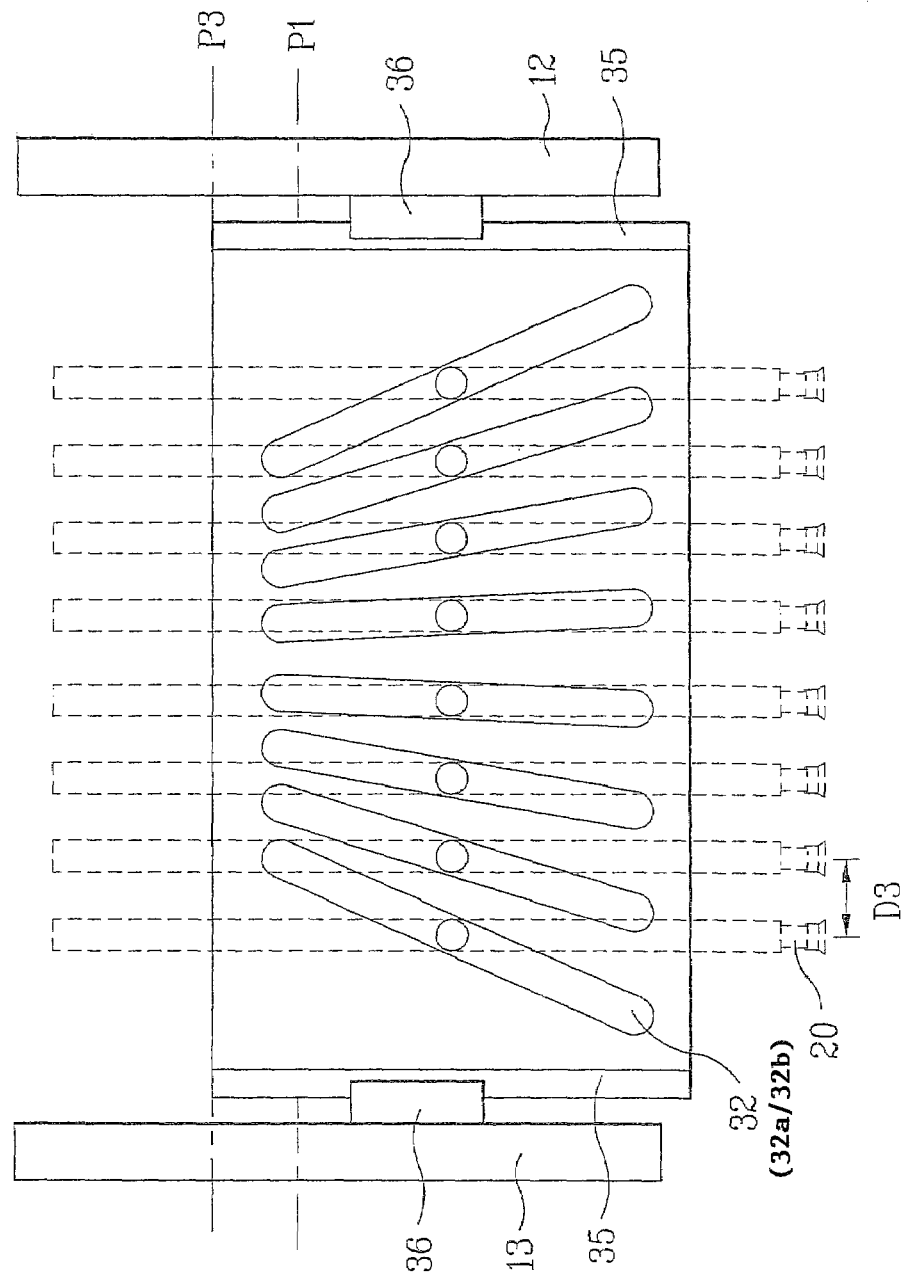

As shown in FIG. 8, when a new control signal is applied to a servo motor 51 the servo motor 51 is driven as opposed to the operation range described above and then the cam plate 30 moves to a third preset position P3.

Thus, connection bars 25 connected to the picker heads 20 are located not at the highest ends of the cam grooves 32 but at a little lower ends of the cam grooves 32 than the highest. Accordingly, each picker heads 20 may have a different minimum distance D3 between each other from the one described above.

Figure 9:
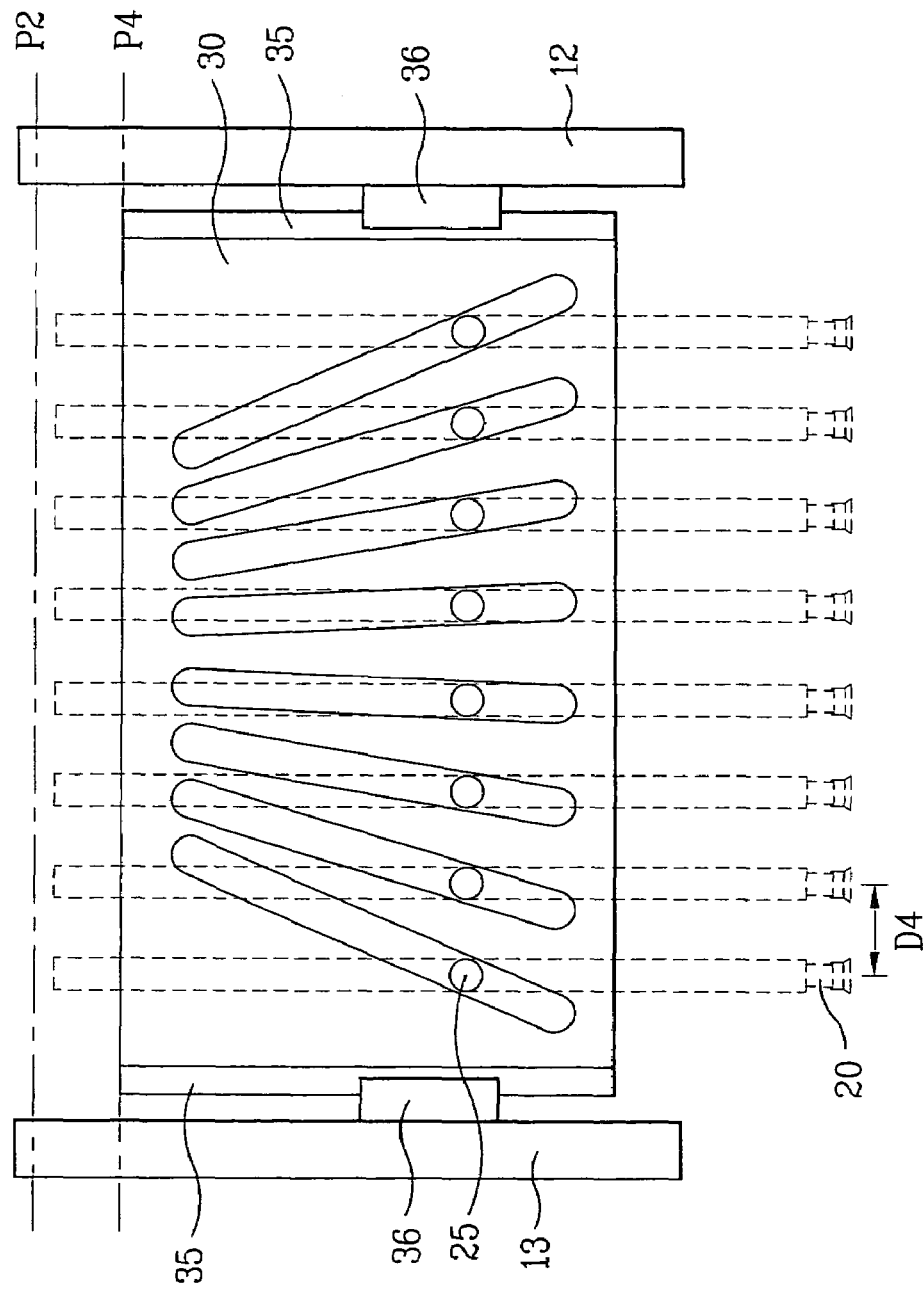

Also, as shown in FIG. 9, when another different signal is applied to the servo motor 51 and the cam plate 30 is moving upward to a fourth preset position P4, the connection bars 25 of each picker head 20 is located in another different position. At this time, the pitch between each picker head 20 is adjusted to a different maximum distance D4 from the one described above.

In case that each pitch between picker heads 20 is needed to be adjusted again due to the change of the kind and/or the size of the semiconductors which will be tested, the user converts a control signal of the servo motor 51 without replacing a cam plate. Hence, the user discretionarily adjusts a moving position of the cam plate, in other words, a relative position between the connection bars 25 and the cam grooves 32, thereby capable of adjusting the pitch between the picker heads 20 into the discretionary pitch he/she wants.

In the embodiment of the transfer device described above, a servo motor 51, a plurality of pulleys 56 to 59, power transmission belts 61, 62 are employed as a driving means for reciprocating the cam plate 30 upward/downward, but the cam plate 30 may be reciprocated upward/downward by means of using a linear motor of a rectilineal figure having a mover and a stator.

Also, power transmission belts and pulleys as described above are employed as a power transmission system for transmitting the power of the servo motor 51, but ball screws also may be employed.

Figure 10:
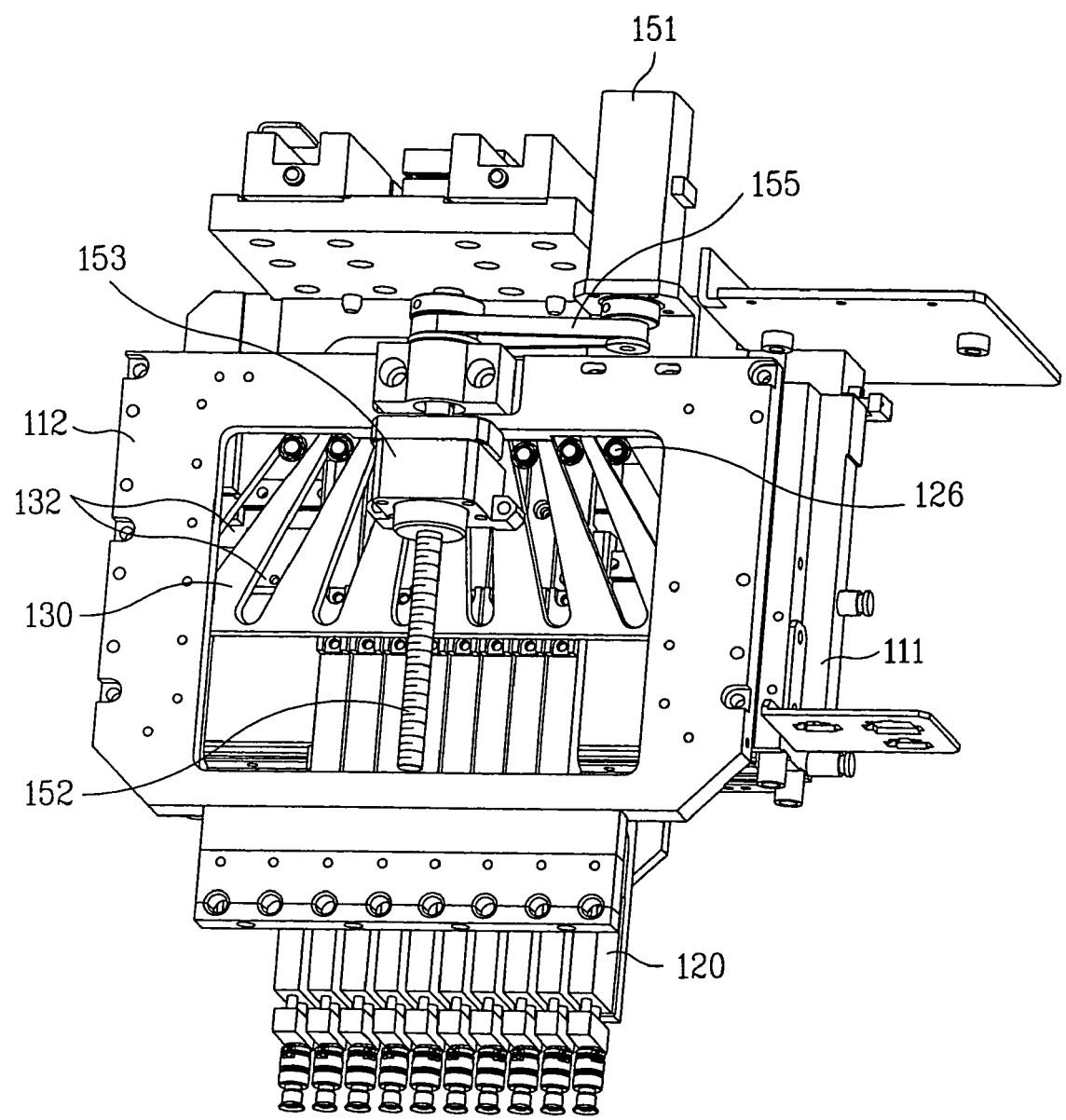
FIGS. 10 and 11 illustrate front perspective views each showing another embodiment of a transfer device according to the present invention.
Figure 11:
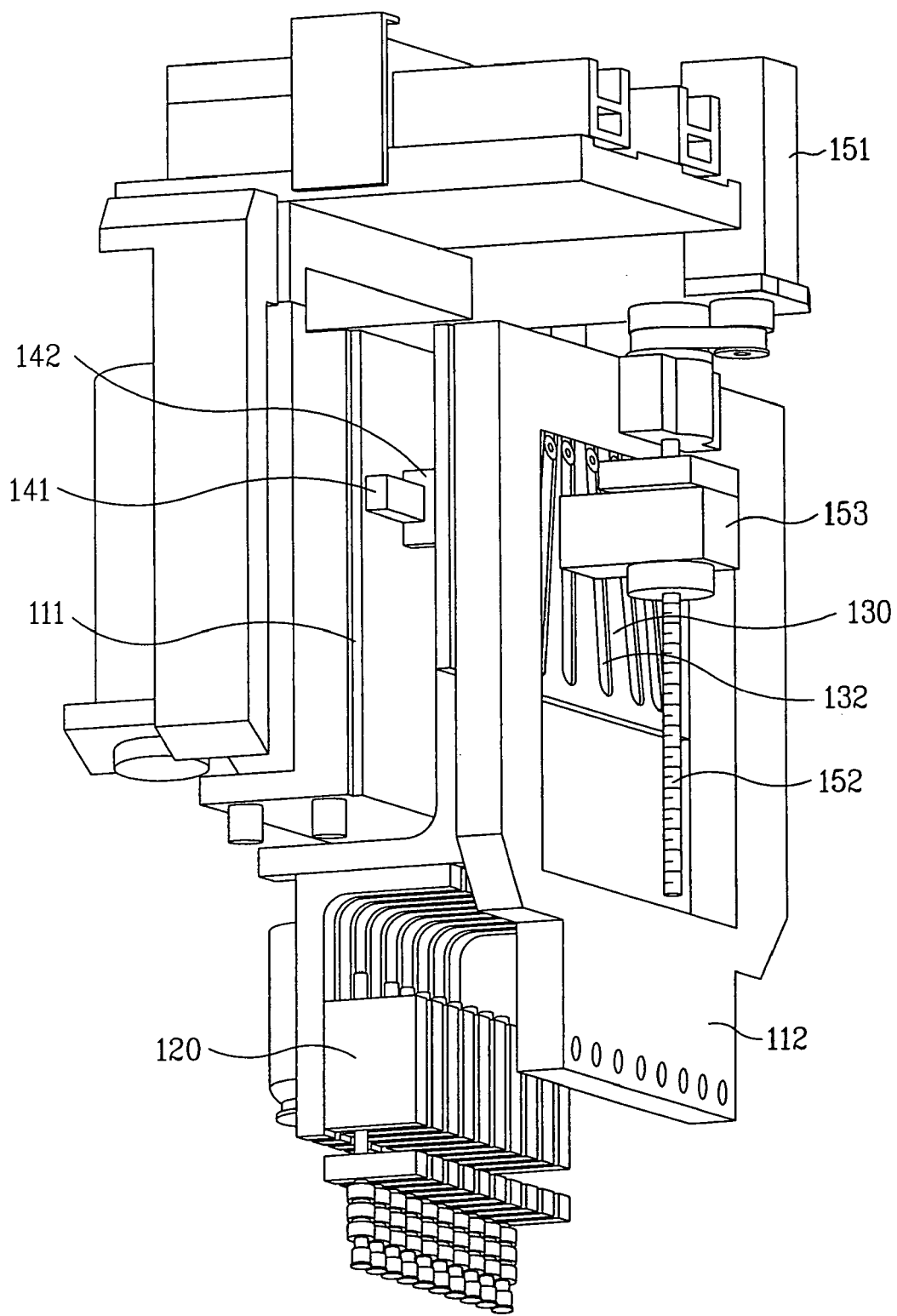

FIGS. 10 and 11 are showing an embodiment of a transfer device using a ball screw as a power transmission system. LM guide rails 141 and LM blocks 142 are installed on a rear base plate 111 for guiding the rightward and leftward motion of a plurality of picker heads 120.

A front base plate 112 of a square frame shape with a center thereof opened is installed parallel spaced apart in front of the rear base plate 111. A cam plate 130 is installed movable upward/downward in rear of the front base plate 112. A plurality of cam grooves 132 is formed on the cam plate 130, extended inclined in a diffuse direction from an upper side to a lower side.

In each cam groove 132, rollers 126 connected correspondingly to each picker head 120 are installed. The rollers 126 roll and contact an inner circumferential surface of each cam groove 132.

In an upper portion of the front base plate 112, a servo motor 151 is installed capable of controlling a position to a discretionary position. Also, in a front portion of the front base plate 112, a ball screw 152 is installed in an upward and downward direction. A nut part 153 moving along the ball screw 152 by means of rotation of the ball screw 152 is connected to the ball screw 152. The nut part 153 is connected to the front side of the cam plate 130 through the opening of the front base plate 112. The upper end of the ball screw 152 is connected to a servo motor 151 by a belt 155 to receive the power.

Hence, when a predetermined signal is applied to the servo motor 151, the power is transmitted to the ball screw 152 by the belt 155, after that the ball screw 152 is rotated at a predetermined amount and then the nut part 153 reciprocates upward/downward along the ball screw 152, thereby reciprocating the cam plate 130 upward/downward.

Each picker head 120 moves leftward/rightward along each LM guide rail 141 and the pitch between each picker head 120 is varied. The pitch adjustment of each picker head 120 by means of the cam plate 130 reciprocating upward/downward is almost the same as that of the described embodiment, thereby omitting the detailed description.

According to the present invention, in case that the distance between each picker head 120 is required to be adjusted, because the kinds or the sizes of the semiconductors tested in one handler are varied, the position of the cam plate may be varied by means of varying a control signal of a motor driving the cam plate without replacing the cam plate. Therefore, the pitch of each picker head may be adjusted to the discretionary pitch as wanted.

Accordingly, the working time loss caused by replacing the cam plate may be removed and the productivity may be enhanced drastically.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transfer device of a handler for testing semiconductor devices, the transfer device comprising:
   a base part;
   a plurality of picker heads movably on the base part;
   a cam plate movably coupled to the base part and having a plurality of inclined cam grooves formed therein;
   connection bars each having first side thereof secured to one of the picker head and a second side thereof movably connected to one of the cam grooves; and
   a driving unit that reciprocates the cam plate so as to move the picker heads between a first position and a second position, wherein the driving unit comprises:
      a motor provided with the base part; and
      a power transmission part that converts power from the motor to a reciprocal motion of the cam plate, wherein the power transmission part comprises:
         a driving pulley engaged with a drive shaft that receives power from the motor;
         first pulleys rotatably mounted on a power transmission shaft coupled to the base part, and engaged with the driving pulley so as to rotate together with the driving pulley;
         second pulleys rotatably coupled to the base part at a predetermined distance from the first pulleys;
         power transmission belts that connect the first pulleys with the second pulleys; and
         connection parts that connect the power transmission belts with the cam plate.

2. The transfer device of claim 1, wherein the first pulleys, the second pulleys and the power transmission belts are respectively positioned facing each other on opposite sides of the base part.

3. The transfer device of claim 1, further comprising a pair of guide rails provided on opposite side edges of the cam plate movably connected to a corresponding pair of guide blocks secured to the base part.

4. A transfer device of a handler for testing semiconductor devices, the transfer device comprising:
   a base part;
   a cam plate movably coupled to the base part and having a plurality of inclined cam grooves formed therein;
   a plurality of picker heads movably on the base part, wherein the plurality of picker heads comprises a first picker head row and a second picker head row arranged in two separate rows with respect to the cam plate; and
   connection bars each having first side thereof secured to one of the picker heads and a second side thereof movably connected to one of the cam grooves, wherein connection bars connected to each picker head of the first picker head row are connected to a corresponding cam groove in a first side of the cam plate, and connection bars connected to each picker head of the second picker head row are connected to a corresponding cam groove in a second side of the cam plate so as to move synchronously together.

5. The transfer device of claim 4, wherein the first sides of the connection bars all have a same position within their respective cam groove such that an adjustment in pitch between adjacent picker heads of the first picker head row and between adjacent picker heads of the second picker head row is performed equally as the cam reciprocates relative to the base part.

6. The transfer device of claim 4, further comprising a first horizontal guide rail and a second guide rail mounted in parallel on the base part to guide horizontal movement of the picker heads, wherein even numbered picker heads and odd numbered picker heads are alternately and movably arranged on the first and second horizontal guide rails.

7. A transfer device of a handler for testing semiconductor devices, the transfer device comprising:
   a base;
   a cam plate movably coupled to the base, the cam plate having a plurality of inclined cam grooves formed therein;
   a plurality of picker heads movably mounted on the base, arranged in a first picker head row extending along a first side of the cam plate and a second picker head row extending along a second side of the cam plate, the first and second picker head rows each comprising a plurality of picker heads;
   a plurality of first connecting bars being connected at a first end thereof to the picker heads of the first picker head row and at a second end thereof to corresponding first cam grooves formed in the first side of the cam plate so as to connect each picker head to a corresponding inclined cam groove;
   a plurality of second connecting bars being connected at a first end thereof to the picker heads of the second picker head row and at a second end thereof to corresponding second cam grooves formed in the second side of the cam plate so as to connect each picker head to a corresponding inclined cam groove; and
   a driver that reciprocally moves the cam plate relative to the base so as to vary a position of the picker heads from a first position to a second position based on a position of the second ends of the plurality of first and second connecting bars in the corresponding plurality of first and second cam grooves.

8. The transfer device of claim 7, wherein a position of the plurality of first connecting bars in the plurality of first cam grooves corresponds to a position of the plurality of second connecting bars in the plurality of second cam grooves as the cam plate moves relative to the base.

9. The transfer device of claim 8, wherein an inclined position of the plurality of first cam grooves on the first side of the cam plate is substantially the same as an inclined position of the plurality of second cam grooves on the second side of the cam plate.

10. The transfer device of claim 9, wherein a pitch between adjacent picker heads of the first picker head row is adjusted as the cam plate moves upward and downward and the first connecting bars slide within their respective first cam grooves, and wherein a pitch between adjacent picker heads of the second picker head row is adjusted as the respective first cam grooves. cam plate moves upward and downward and the first connecting bars slide within their respective first cam grooves.

11. The transfer device of claim 10, wherein a pitch between adjacent picker heads is adjusted substantially uniformly in the first and second picker head rows as the cam plate moves upward and downward relative to the base and the first and second connecting bars move in the first and second cam grooves, respectively.

* * * * *